(12) United States Patent
Park et al.

(10) Patent No.: US 9,903,994 B2
(45) Date of Patent: Feb. 27, 2018

(54) LIGHT EMITTING DEVICE, BACKLIGHT UNIT AND DISPLAY APPARATUS

(71) Applicant: SAMSUNG ELECTRONICS CO., LTD., Suwon-si, Gyeonggi-do (KR)

(72) Inventors: Young Sam Park, Seoul (KR); Hun Joo Hahm, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 468 days.

(21) Appl. No.: 14/484,055

(22) Filed: Sep. 11, 2014

(65) Prior Publication Data

US 2015/0301259 A1    Oct. 22, 2015

(30) Foreign Application Priority Data

Apr. 17, 2014  (KR) .................. 10-2014-0045858

(51) Int. Cl.
| | | |
|---|---|---|
| H01L 33/06 | (2010.01) | |
| F21V 8/00 | (2006.01) | |
| H01L 33/50 | (2010.01) | |
| G02F 1/1335 | (2006.01) | |
| H01L 33/08 | (2010.01) | |

(52) U.S. Cl.
CPC ......... *G02B 6/0026* (2013.01); *G02B 6/0073* (2013.01); *G02F 1/133603* (2013.01); *H01L 33/502* (2013.01); *B32B 2457/202* (2013.01); *G02F 2001/133614* (2013.01); *G02F 2001/133624* (2013.01); *G02F 2202/36* (2013.01); *H01L 33/08* (2013.01); *H01L 33/505* (2013.01); *H01L 2224/48091* (2013.01); *H01L 2224/48247* (2013.01); *H01L 2224/48257* (2013.01)

(58) Field of Classification Search
None
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |

(Continued)

FOREIGN PATENT DOCUMENTS

| | | |
|---|---|---|
| JP | 2011-155948 A | 8/2011 |
| KR | 10-0900670 A | 6/2009 |
| KR | 10-2009-0108171 A | 10/2009 |

*Primary Examiner* — Anthony J Frost
(74) *Attorney, Agent, or Firm* — Lee & Morse, P.C.

(57) ABSTRACT

A light emitting device includes: a substrate; a light emitting element mounted on the substrate and emitting blue light and green light; and a wavelength conversion part wavelength-converting a portion of light emitted from the light emitting element into red light, and including fluoride-based phosphors represented by Chemical Formula: $A_xMF_y:Mn^{4+}$ ($2 \leq x \leq 3$ and $4 \leq y \leq 7$, where element A is at least one selected from a group consisting of Li, Na, K, Rb, and Cs and element M is at least one selected from a group consisting of Si, Ti, Zr, Hf, Ge and Sn) and organic or inorganic coating layers enclosing the fluoride-based phosphors.

19 Claims, 9 Drawing Sheets

(56) References Cited

U.S. PATENT DOCUMENTS

| | | |
|---|---|---|
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,497,973 B2 | 3/2009 | Radkov et al. |
| 7,501,656 B2 | 3/2009 | Han et al. |
| 7,709,857 B2 | 5/2010 | Kim et al. |
| 7,759,140 B2 | 7/2010 | Lee et al. |
| 7,759,683 B2 | 7/2010 | Lee |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2007/0108455 A1* | 5/2007 | Sun ............... H01L 25/0753 257/89 |
| 2008/0048193 A1 | 2/2008 | Yoo et al. |
| 2009/0194775 A1* | 8/2009 | Chakraborty ........ H01L 33/50 257/95 |
| 2011/0255265 A1* | 10/2011 | Nammalwar ...... C09K 11/0883 362/84 |
| 2012/0205616 A1* | 8/2012 | Zhang ............ H01L 21/02458 257/13 |
| 2012/0250350 A1* | 10/2012 | Kim ................. G02F 1/133606 362/606 |
| 2012/0305955 A1* | 12/2012 | Hussell .............. C09K 11/7774 257/98 |

* cited by examiner

LIGHT EMITTING DEVICE, BACKLIGHT UNIT AND DISPLAY APPARATUS

CROSS-REFERENCE TO RELATED APPLICATION

This application claims the benefit of Korean Patent Application No. 10-2014-0045858 filed on Apr. 17, 2014, with the Korean Intellectual Property Office, the disclosure of which is incorporated herein by reference.

BACKGROUND

The present disclosure relates to a light emitting device, a backlight unit and a display apparatus.

A light emitting diode (LED) is commonly seen a next generation light source having many positive attributes such as a relatively long lifespan, low power consumption, a rapid response rate, environmentally friendly characteristics, and the like, as compared with a light source according to the related art, and has been prominent as an important light source in various products such as illumination devices, backlight units for display devices, and the like. In particular, Group III nitride-based LEDs including GaN, AlGaN, InGaN, InAlGaN, and the like, mainly serve as a semiconductor light emitting device outputting blue light or ultraviolet light.

A light emitting device using such an LED may include a light emitting element supplying excitation light and phosphors excited by the light emitted from the light emitting element to thereby emit wavelength-converted light, such that desired color characteristics may be implemented. Accordingly, research into a phosphor having superior color reproducibility and reliability and a light emitting device using the phosphor has been demanded.

SUMMARY

An aspect of the present disclosure may provide a light emitting device, a backlight unit and a display apparatus having high color purity and improved reliability.

According to an aspect of the present disclosure, a light emitting device may include: a substrate; a light emitting element mounted on the substrate and emitting blue light and green light; and a wavelength conversion part wavelength-converting a portion of light emitted from the light emitting element into red light, and including fluoride-based phosphors represented by Chemical Formula: $A_xMF_y:Mn^{4+}$ ($2\leq x\leq 3$ and $4\leq y\leq 7$, where element A is at least one selected from a group consisting of Li, Na, K, Rb, and Cs and element M is at least one selected from a group consisting of Si, Ti, Zr, Hf, Ge and Sn) and organic or inorganic coating layers enclosing the fluoride-based phosphors.

The blue light, the green light and the red light may have a full width at half maximum (FWHM) of less than 35 nm.

The red light may have a full width at half maximum (FWHM) of less than 10 nm.

The light emitting element may include an active layer including first and second quantum well layers having different band gap energy.

The light emitting element may have a first region in which light emitting nanostructures are spaced apart from each other by a first distance and a second region in which light emitting nanostructures are spaced apart from each other by a second distance greater than the first distance.

In the first and second regions, the light emitting nanostructures may contain different contents of indium (In).

The light emitting device may further include a protective layer disposed on at least one surface of the wavelength conversion part and performing moisture-proofing functions.

The protective layer may include a first protective layer disposed between the substrate and the wavelength conversion part and a second protective layer disposed on an upper surface of the wavelength conversion part.

The wavelength conversion part may be enclosed by the protective layer.

The protective layer may be a moisture-proofing coating layer or a resin layer.

According to another aspect of the present disclosure, a backlight unit may include a light guiding plate; a light source module disposed on at least one side surface of the light guiding plate, providing light to an interior of the light guiding plate and including a circuit board and a plurality of light emitting elements; and a wavelength conversion part wavelength-converting a portion of light emitted from the plurality of light emitting elements into red light, and including fluoride-based phosphors represented by Chemical Formula: $A_xMF_y:Mn^{4+}$ ($2\leq x\leq 3$ and $4\leq y\leq 7$, where element A is at least one selected from a group consisting of Li, Na, K, Rb, and Cs and element M is at least one selected from a group consisting of Si, Ti, Zr, Hf, Ge and Sn) and organic or inorganic coating layers enclosing the fluoride-based phosphors.

The wavelength conversion part may include a plurality of wavelength conversion parts respectively disposed above the plurality of light emitting elements.

The wavelength conversion part may be disposed on one surface of the light guiding plate.

Each of the light emitting elements may emit blue light and green light simultaneously.

According to another aspect of the present disclosure, a display apparatus may include: a backlight unit including a light guiding plate and a light emitting element; at least one optical sheet disposed on the backlight unit; and a liquid crystal panel disposed on the optical sheet and including a liquid crystal layer and a color filer, wherein the backlight unit or the liquid crystal panel includes a wavelength conversion part disposed therein, wavelength-converting a portion of light emitted from the light emitting element into red light, and including fluoride-based phosphors represented by Chemical Formula: $A_xMF_y:Mn^{4+}$ ($2\leq x\leq 3$ and $4\leq y\leq 7$, where element A is at least one selected from a group consisting of Li, Na, K, Rb, and Cs and element M is at least one selected from a group consisting of Si, Ti, Zr, Hf, Ge and Sn).

According to an aspect of the present disclosure, a light emitting device may include: a substrate; a light emitting element mounted on the substrate and emitting blue light and green light; a wavelength conversion part wavelength-converting a portion of light emitted from the light emitting element into red light, and including fluoride-based phosphors represented by Chemical Formula: $A_xMF_y:Mn^{4+}$ ($2\leq x\leq 3$ and $4\leq y\leq 7$, where element A is at least one selected from a group consisting of Li, Na, K, Rb, and Cs and element M is at least one selected from a group consisting of Si, Ti, Zr, Hf, Ge and Sn); and a coating layer protecting the fluoride-based phosphors.

The coating layer may be a moisture-proofing layer.

The coating layer may include organic or inorganic coating layers enclosing each of the fluoride-based phosphors.

The coating layer may include a protective layer disposed on at least one surface of the wavelength conversion part.

The red light may have a full width at half maximum (FWHM) of less than 10 nm.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 1:
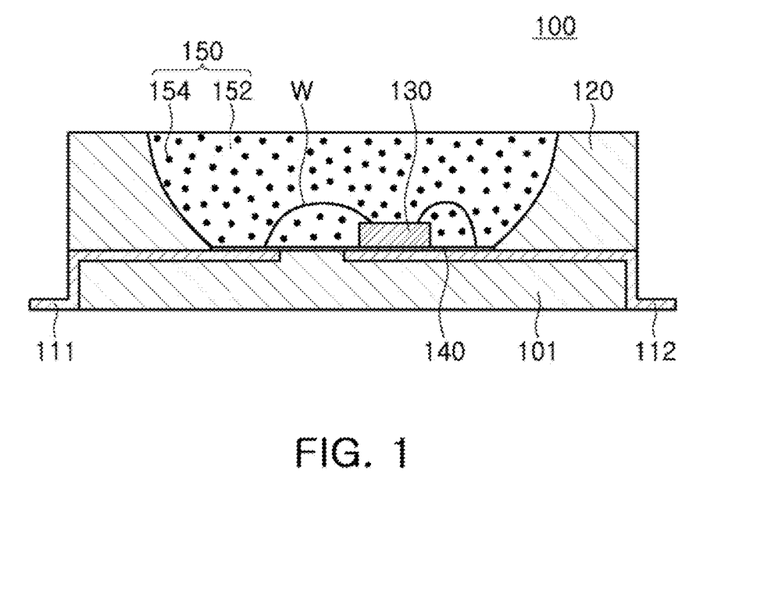
FIG. 1 is a schematic cross-sectional view of a light emitting device according to an exemplary embodiment of the present disclosure.

FIG. 1 is a schematic cross-sectional view of a light emitting device according to an exemplary embodiment of the present disclosure.

Referring to FIG. 1, a light emitting device 100 may include a substrate 101, a light emitting element 130 disposed on the substrate 101, a protective layer 140 and a wavelength conversion part 150. The light emitting device 100 may also include a pair of lead frames 111 and 112 electrically connected to the light emitting element 130, a body part 120 having a cup shape, and a conductive wire W connecting the light emitting element 130 and the lead frames 111 and 112 to each other. Thus, the light emitting device 100 may configure a light emitting device package.

In the specification, the terms 'above', 'upper portion', 'upper surface', 'below' 'lower portion', 'lower surface' and the like, are used based on the drawings, and may actually be different depending on a direction in which a component is disposed.

The substrate 101 may be formed by molding an opaque resin or a resin having high reflectance and may be formed of a polymer resin allowing for ease in performing an injection molding process. Further, the substrate 101 may be formed of ceramics and in this case, the heat dissipation may be facilitated. According to exemplary embodiments, the substrate 101 may be a printed circuit board provided with wiring patterns.

The pair of lead frames 111 and 112 may be disposed on the substrate 101 and be electrically connected to the light emitting element 130 in order to supply operating power to the light emitting element 130. The lead frames 111 and 112 may be electrically connected to the light emitting element 130 via the conductive wire W and may be used as terminals to supply an external electrical signal to the light emitting element 130. To serve as the terminals, the lead frames 111 and 112 may be formed of a highly conductive metal. According to exemplary embodiments, the light emitting element 130 may directly contact the lead frames 111 and 112 without using the conductive wire W to be connected thereto.

The body part 120 may be disposed on the substrate 101 and the lead frames 111 and 112 and have a cavity receiving the light emitting element 130 therein. The body part 120 may have a cup shape in order to increase reflection efficiency of light, but is not limited thereto. According to exemplary embodiments, the body part 120 may be formed integrally with the substrate 101 to configure a package body.

The light emitting element 130 may be a photoelectric device disposed on an upper surface of the substrate 101 and emitting light when an electrical signal is applied thereto. The light emitting device 100 may simultaneously emit green light and blue light. For example, the light emitting element 130 may be a semiconductor light emitting element including an epitaxially-grown semiconductor layer. In addition, the light emitting element 130 may be a light emitting nano-element including a plurality of light emitting nano-structures. A structure of the light emitting element 130 will be described in detail with reference to FIGS. 4A and 4B.

The wavelength conversion part 150 may be disposed within the cavity of the body part 120 and may include a sealing part 152 and fluoride-based phosphors 154 dispersed within the sealing part 152. The wavelength conversion part 150 may be excited by light emitted from the light emitting element 130 and emit visible light having a converted wavelength. For example, the fluoride-based phosphors 154 may be excited by blue light emitted from the light emitting element 130 to emit red light. The sealing part 152 may be formed of a light transmitting resin, for example, epoxy, silicon, modified silicon, a urethane resin, an oxetane resin, acrylics, polycarbonate, polyimide or combinations thereof.

The fluoride-based phosphors 154 may be red phosphors represented by the following Chemical Formula (1).

$$A_xMF_y:Mn^{4+} \qquad \text{Chemical Formula (1):}$$

($2 \leq x \leq 3$ and $4 \leq y \leq 7$ are satisfied, where element A is at least one selected from a group consisting of Li, Na, K, Rb, and Cs and element M is at least one selected from a group consisting of Si, Ti, Zr, Hf, Ge and Sn)

The protective layer 140 may be disposed on at least one surface of the wavelength conversion part 150. In the exemplary embodiment, the protective layer 140 may be disposed on a lower surface of the wavelength conversion part 150, that is, disposed between the wavelength conversion part 150 and the substrate 101, but the disposition of the protective layer 140 may be variously altered according to exemplary embodiments. For example, the protective layer 140 may be disposed on all of upper and lower surfaces of the wavelength conversion part 150, or may be positioned to encompass the entirety of the wavelength conversion part 150.

The protective layer 140 may protect the fluoride-based phosphors 154 from external environmental factors, in particular, moisture, such that reliability of the light emitting device 100 may be secured. The protective layer 140 according to the exemplary embodiment may protect the wavelength conversion part 150 from moisture permeating and introduced into the substrate 101 from external environment. Thus, the protective layer 140 may be formed of a moisture-proofing material capable of preventing the permeation of moisture, and a thickness of the protective layer 140 is not limited to the embodiment illustrated in FIG. 1.

The protective layer 140 may be formed of a resin such as epoxy, silicon, modified silicon, a urethane resin, an oxetane resin, acrylics, polycarbonate, polyimide or the like. In this case, a refractive index of the protective layer 140 may be different from that of the sealing part 152 and due to the difference in refractive indices, light extraction efficiency may be improved. Alternatively, the protective layer 140 may be a coating layer formed of a fluoride-based coating agent or a silica-based coating agent.

Figure 2:
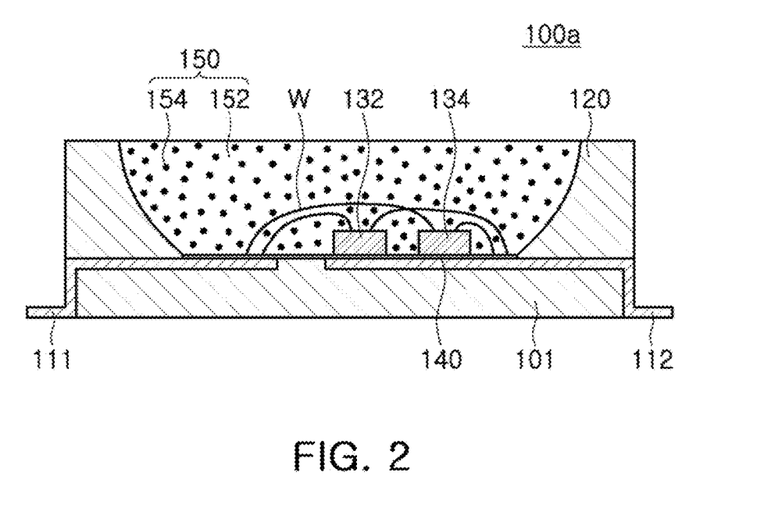
FIG. 2 is a schematic cross-sectional view of a light emitting device according to an exemplary embodiment of the present disclosure.

FIG. 2 is a schematic cross-sectional view of a light emitting device according to an exemplary embodiment of the present disclosure.

Referring to FIG. 2, a light emitting device 100a may include the substrate 101, first and second light emitting elements 132 and 134 disposed on the substrate 101, the protective layer 140, and the wavelength conversion part 150. The light emitting device 100a may also include the pair of lead frames 111 and 112 electrically connected to the first and second light emitting elements 132 and 134, the body part 120 having a cup shape, and conductive wires W respectively connecting the first and second light emitting elements 132 and 134 and the lead frames 111 and 112 to each other.

In the light emitting device 100a according to the exemplary embodiment, unlike the foregoing exemplary embodiment of FIG. 1, two light emitting elements such as the first and second light emitting elements 132 and 134 may be mounted on the substrate 101. The first and second light emitting elements 132 and 134 may emit light having wavelengths different from each other. For example, the first light emitting element 132 may emit green light and the second light emitting element 134 may emit blue light.

Figure 3:
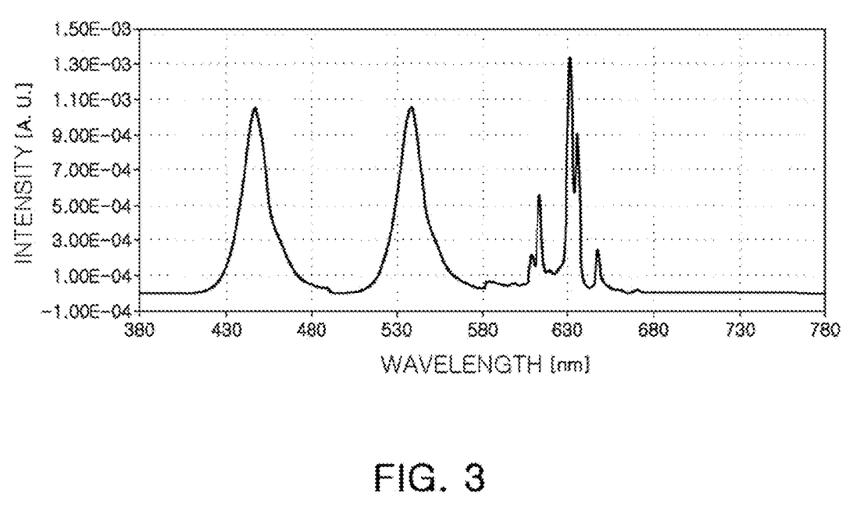
FIG. 3 is a light emitting spectrum view illustrating an emission wavelength of the light emitting device according to an exemplary embodiment of the present disclosure.

FIG. 3 is a light emitting spectrum view illustrating an emission wavelength of the light emitting device according to an exemplary embodiment of the present disclosure.

Referring to FIG. 3, the light emitting device may emit blue light, green light and red light. The blue light may have a wavelength range of about 370 nm to 500 nm, the green light may have a wavelength range of about 500 nm to 600 nm, and the red light may have a wavelength range of about 600 nm to 700 nm. In addition, the light emitting device according to the exemplary embodiment may emit blue light, green light and red light each having a full width at half maximum (FWHM) of about 35 nm or less.

As described above with reference to FIGS. 1 and 2, the light emitting device according to the exemplary embodiment may emit green light through the light emitting element, such that light having a relatively small full width at half maximum, as compared to the case of emitting green light using a phosphor, may be emitted. Further, the light emitting device according to the exemplary embodiment may emit red light having a full width at half maximum (FWHM) of 10 nm or less as described in FIG. 3, by using the fluoride-based phosphors. Thus, the number of light emitting elements included within a single light emitting device may be minimized, while three colored light beams having a small full width at half maximum (FWHM) may be emitted to allow for light emitting efficiency to be secured. In a case in which the light emitting device configured as above is used in a display apparatus using a color filter, and the like, light having high color purity may be obtained.

In detail, results obtained by simulating color reproducibility of white light emitted from the light emitting device according to the exemplary embodiment of the present disclosure are shown in Table 1.

TABLE 1

|  |  | NTSC | Adobe | DCI |
| --- | --- | --- | --- | --- |
| WCG Panel | Inventive Example | 114.1 | 119.4 | 118.8 |
|  | Comparative Example | 89.1 | 93.2 | 92.7 |
| General Panel | Inventive Example | 98.2 | 102.8 | 102.2 |
|  | Comparative Example | 71.2 | 74.5 | 74.1 |

Referring to Table 1, with regard to the inventive examples of the present disclosure and the comparative examples, area ratios in the CIE 1976 color coordinate system are shown. As described above with reference to FIG. 1, the inventive example according to the present disclosure corresponds to a light emitting device including a single light emitting element emitting blue light and green light together and fluoride-based red phosphors. The comparative example corresponds to a light emitting device including a light emitting element emitting blue light, yellow phosphors and red phosphors. The area ratios were respectively calculated based on NTSC, Adobe RGB and DCI (Digital Cinema Initiative) standards with respect to a wide color gamut (WCG) panel and a general panel.

As indicated in Table 1, since the light emitting devices according to the inventive examples of the present disclosure have relatively large color expression regions, as compared to the comparative examples, it can be confirmed that light emitting devices emitting white light while having improved color characteristics may be obtained.

Figure 4A:
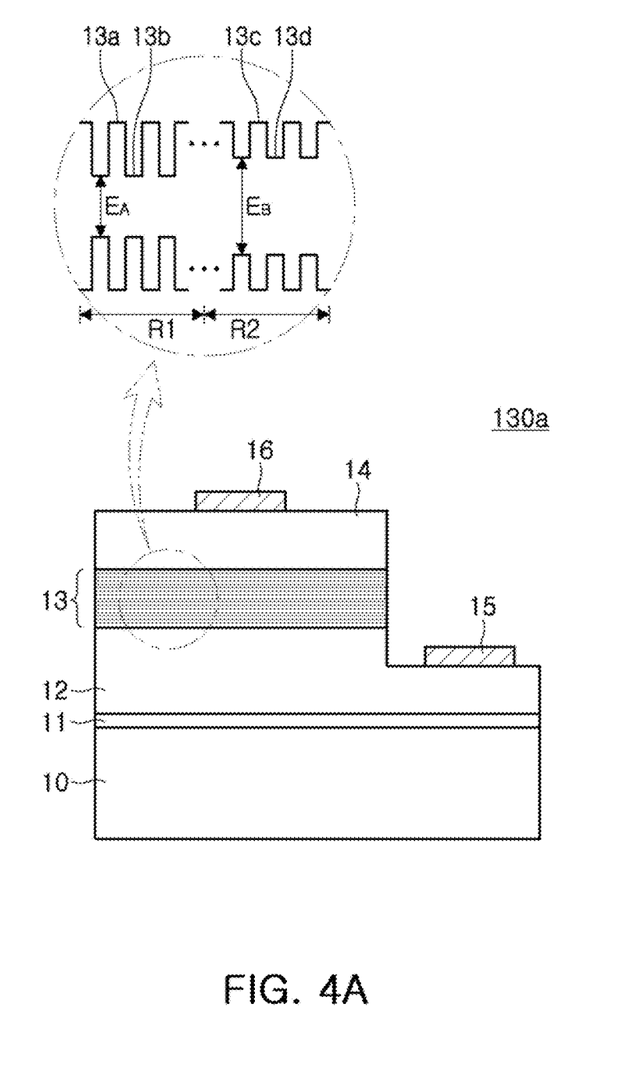
FIGS. 4A and 4B are schematic cross-sectional views of light emitting elements usable in the light emitting device according to an exemplary embodiment of the present disclosure.
Figure 4B:
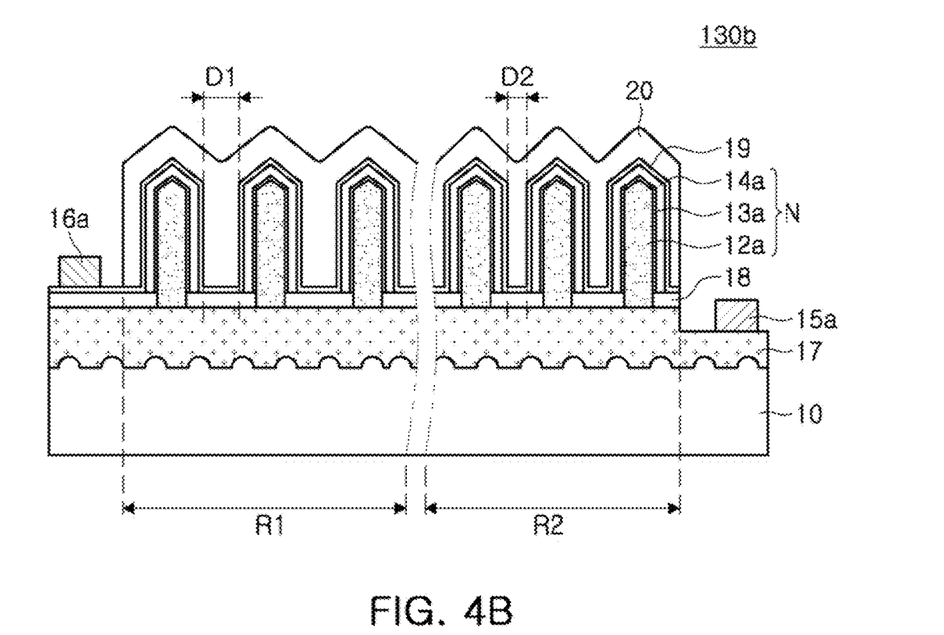

FIGS. 4A and 4B are schematic cross-sectional views of light emitting elements usable in the light emitting device according to an exemplary embodiment of the present disclosure.

In detail, FIGS. 4A and 4B illustrate light emitting elements usable in the exemplary embodiment of FIG. 1.

Referring to FIG. 4A, a light emitting element 130a may include an element substrate 10, a buffer layer 11 formed on the element substrate 10, a first conductivity type semiconductor layer 12, an active layer 13, and a second conductivity type semiconductor layer 14 and may further include first and second electrodes 15 and 16. Further, the active layer 13 may include quantum barrier layers 13a and 13c and quantum well layers 13b and 13d.

The element substrate 10 may be provided as a substrate for the growth of a semiconductor and may be formed of an insulating material, a conductive material or a semiconductor material such as sapphire, SiC, MgAl$_2$O$_4$, MgO, LiAlO$_2$, LiGaO$_2$, GaN or the like. Depending on exemplary embodiments, a plurality of unevenness structures may be formed on an upper surface of the element substrate 10, that is, a growth surface of semiconductor layers. Due to the unevenness structures, crystallinity of the semiconductor layers, light emission efficiency, and the like may be improved.

The buffer layer 11 may be provided to alleviate stress acting on the first conductivity type semiconductor layer 12 to improve crystallinity and may be formed of AlN, GaN or AlGaN. However, the buffer layer 11 may not be an essential component and may be omitted depending on exemplary embodiments.

The first and second conductivity type semiconductor layers 12 and 14 may be formed of semiconductors doped with n-type impurities and p-type impurities, respectively, but are not limited thereto. The first and second conductivity type semiconductor layers 12 and 14 may also be formed of semiconductors doped with p-type impurities and n-type impurities, respectively. The first and second conductivity type semiconductor layers 12 and 14 may be formed of a nitride semiconductor, for example, a material having a composition of Al$_x$In$_y$Ga$_{1-x-y}$N (0≤x≤1, 0≤y≤1, 0≤x+y≤1), and each of the semiconductor layers may be formed of a single layer but may be formed of a plurality of different layers depending on a doping concentration, composition and the like. In addition to the nitride semiconductor, the first and second conductivity type semiconductor layers 12 and 14 may be formed of an AlInGaP or AlInGaAs based semiconductor.

The active layer 13 disposed between the first and second conductivity type semiconductor layers 12 and 14 may emit light having a predetermined amount of energy due to the recombination of electrons and holes and may have a multiple quantum well (MQW) structure in which quantum barrier layers 13a and 13c and quantum well layers 13b and 13d are alternately stacked. For example, in the case that the active layer 13 is formed of a nitride semiconductor, a GaN/InGaN structure may be used. In particular, in the light emitting element 130a according to the exemplary embodiment, the active layer 13 may have first and second regions R1 and R2. Band gap energy $E_A$ of the quantum well layer 13b in the first region R1 may be lower than band gap energy $E_B$ of the quantum well layer 13d in the second region R2. Such a difference in levels of band gap energy may be adjusted depending on a composition of the quantum well layers 13b and 13d, for example, the content of indium (In). In accordance with an increase in the content of indium (In), band gap energy may be reduced. Therefore, the first region R1 may emit green light and the second region R2 may emit blue light, such that all of green light and blue light may be emitted from a single active layer 13 in the light emitting element 130a.

The first and second electrodes 15 and 16 may be electrically connected to the first and second conductivity type semiconductor layers 12 and 14, respectively. The first and second electrodes 15 and 16 may be formed of an electrical conductive material, for example, one or more of Ag, Al, Ni, Cr and the like. According to exemplary embodiments, the first and second electrodes 15 and 16 may be transparent electrodes, for example, indium tin oxide (ITO), aluminum zinc oxide (AZO), indium zinc oxide (IZO), ZnO, GZO (ZnO:Ga), In$_2$O$_3$, SnO$_2$, CdO, CdSnO$_4$, or Ga$_2$O$_3$. Positions and shapes of the first and second electrodes 15 and 16 illustrated in FIG. 4A may be provided by way of example and may be variously altered according to exemplary embodiments.

Referring to FIG. 4B, a light emitting element 130b may include the element substrate 10, a first conductivity type semiconductor base layer 17 formed on the element substrate 10, an insulating layer 18, light emitting nanostructures N, a transparent electrode layer 19, and a filling layer 20. The light emitting nanostructures N may include first conductivity type semiconductor cores 12a grown from the first conductivity type semiconductor base layer 17, an active layer 13a, and a second conductivity type semiconductor layer 14a. The light emitting element 130b may further include first and second electrodes 15a and 16a electrically connected to the first conductivity type semiconductor base layer 17 and the second conductivity type semiconductor layer 14a, respectively.

The element substrate 10 may be provided as a semiconductor growth substrate.

The first conductivity type semiconductor base layer 17 may be disposed on the element substrate 10. The first conductivity type semiconductor base layer 17 may be formed of a group III-V compound, for example, GaN. The first conductivity type semiconductor base layer 17 may be formed of n-GaN doped with n-type impurities. In the exemplary embodiments, the first conductivity type semiconductor base layer 17 may provide a crystal surface for growing the first conductivity type semiconductor cores 12a of the light emitting nanostructures N and may be connected to one side of the light emitting nanostructures N in common, thereby serving as a contact electrode.

The insulating layer 18 may be disposed on the first conductivity type semiconductor base layer 17. The insulating layer 18 may be formed of silicon oxide or silicon nitride, for example, at least one of SiO$_x$, SiO$_x$N$_y$, Si$_x$N$_y$, Al$_2$O$_3$, TiN, AlN, ZrO, TiAlN, and TiSiN. The insulating layer 18 may include a plurality of openings exposing portions of the first conductivity type semiconductor base layer 17. Diameters, lengths, positions and growth conditions of the light emitting nanostructures N may be determined depending on sizes of the plurality of openings. The plurality of openings may have various shapes such as circular, quadrangular, hexagonal and other shapes.

A plurality of the light emitting nanostructures N may be disposed in positions corresponding to the plurality of openings. The light emitting nanostructures N may have a core-shell structure including the first conductivity type semiconductor cores 12a grown from exposed regions of the first conductivity type semiconductor base layer 17 exposed by the plurality of openings, and the active layer 13a and the second conductivity type semiconductor layer 14a sequentially formed on surfaces of the first conductivity type semiconductor cores 12a. Further, FIG. 4B illustrates a case in which widths of the first conductivity type semiconductor cores 12a are identical to those of the openings in the insulating layer 18, but it is provided by way of example. The widths of the first conductivity type semiconductor cores 12a may be greater than those of the openings in an upper portion of the insulating layer 18.

The first conductivity type semiconductor cores 12a and the second conductivity type semiconductor layer 14a may be formed of semiconductors doped with n-type impurities and p-type impurities, respectively, but are not limited thereto. The first conductivity type semiconductor cores 12a and the second conductivity type semiconductor layer 14a may be formed of semiconductors doped with p-type impurities and n-type impurities, respectively. The active layer 13a may be disposed on the surfaces of the first conductivity type semiconductor cores 12a. The active layer 13a may emit light having a predetermined amount of energy due to the recombination of electrons and holes and may be a layer formed of a single material such as InGaN or the like. Alternatively, the active layer 13a may have a single or multiple quantum well structure in which quantum barrier layers and quantum well layers are alternately disposed.

In particular, the light emitting element 130b according to the exemplary embodiment may have first and second regions R1 and R2. A distance D1 between the light emitting nanostructures N adjacent to each other in the first region R1 may be greater than a distance D2 between the light emitting nanostructures N adjacent to each other in the second region R2. Due to the different distances, impurities doped in the active layer 13a during the formation of the active layer 13a, for example, the content of indium (In), may be changed, such that the first and second regions R1 and R2 may emit light having different wavelengths. For example, the first region R1 may emit green light and the second region R2 may emit blue light, such that the light emitting element 130b may emit green light and blue light simultaneously.

The number of the light emitting nanostructures N of the light emitting element 130b is not limited to the embodiment illustrated in FIG. 4B. For example, the light emitting element 130b may include several tens to several millions of the light emitting nanostructures N. Each of the light emitting nanostructures N according to the exemplary embodiment may have an upper portion having a hexagonal pyramid shape and a lower portion having a hexagonal pillar shape. According to exemplary embodiments, the light emitting nanostructure N may have a pyramid shape or a pillar shape. Since the light emitting nanostructure N may have a three-dimensional shape as described above, a light emitting surface area may be relatively large to allow for increased light efficiency.

The transparent electrode layer 19 may be electrically connected to the second conductivity type semiconductor layer 14a. The transparent electrode layer 19 may cover upper surfaces and side surfaces of the light emitting nanostructures N, and portions of the transparent electrode layer 19 may be connected to each other between the light emitting nanostructures N adjacent to each other. The transparent electrode layer 19 may be formed of indium tin oxide (ITO), aluminum zinc oxide (AZO), indium zinc oxide (IZO), ZnO, GZO(ZnO:Ga), $In_2O_3$, $SnO_2$, CdO, $CdSnO_4$, or $Ga_2O_3$.

The filling layer 20 may disposed on the light emitting nanostructures N and the transparent electrode layer 19. The filling layer 20 may fill space between the light emitting nanostructures N adjacent to each other and cover the light emitting nanostructures N and the transparent electrode layer 19 disposed on the light emitting nanostructures N. In the exemplary embodiment, an upper surface of the filling layer 20 may be unevenly formed according to shapes of the light emitting nanostructures N. The filling layer 20 may be formed of an light transmitting insulating material and for example, may contain $SiO_2$, $SiN_x$, $Al_2O_3$, $HfO$, $TiO_2$ or $ZrO$.

The first and second electrodes 15a and 16a may be disposed on the first conductivity type semiconductor base layer 17 and the transparent electrode layer 19, respectively, in one side of the light emitting element 130b, so as to be electrically connected to the first conductivity type semiconductor base layer 17 and the second conductivity type semiconductor layer 14a, respectively. The first and second electrodes 15a and 16a may have a single layer structure or a multilayer structure of a conductive material. For example, the first and second electrodes 15a and 16a may contain one or more of Au, Ag, Cu, Zn, Al, In, Ti, Si, Ge, Sn, Mg, Ta, Cr, W, Ru, Rh, Ir, Ni, Pd, Pt and the like, or alloys thereof. However, dispositions and shapes of the first and second electrodes 15a and 16a are provided by way of example and may be variously altered according to exemplary embodiments.

Figure 5:
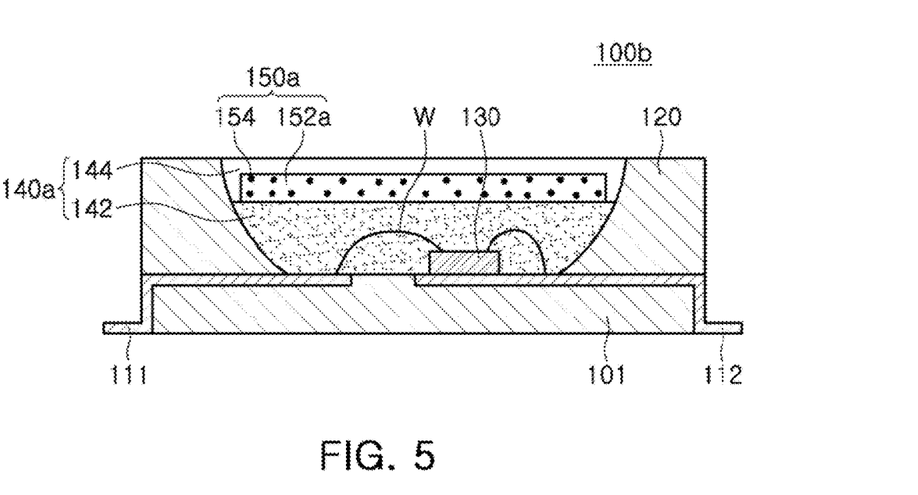
FIG. 5 is a schematic cross-sectional view of a light emitting device according to an exemplary embodiment of the present disclosure.

FIG. 5 is a schematic cross-sectional view of a light emitting device according to an exemplary embodiment of the present disclosure.

Referring to FIG. 5, a light emitting device 100b may include the substrate 101, the light emitting element 130 disposed on the substrate 101, a protective layer 140a, and a wavelength conversion part 150a. The light emitting device 100b may also include the pair of lead frames 111 and 112 electrically connected to the light emitting element 130, the body part 120 having a cup shape, and the conductive wire W connecting the light emitting element 130 and the lead frames 111 and 112 to each other.

The protective layer 140a of the light emitting device 100b according to the exemplary embodiment may include a first protective layer 142 disposed on the substrate 101 and embedding the light emitting element 130 therein and a second protective layer 144 disposed on an upper portion of the wavelength conversion part 150a, unlike in the exemplary embodiment of FIG. 1. Therefore, the wavelength conversion part 150a may be spaced apart from the light emitting element 130 and may be enclosed by the protective layer 140a.

The first protective layer 142 may protect the wavelength conversion part 150a from moisture introduced from a lower portion of the substrate 101. The first protective layer 142 may be formed of a material selected from a group consisting of epoxy, silicon, modified silicon, a urethane resin, an oxetane resin, acrylics, polycarbonate, polyimide and combinations thereof.

The second protective layer 144 may be disposed on the upper portion of the wavelength conversion part 150a and effectively block moisture permeating into the upper portion of the wavelength conversion part 150a from the outside. The second protective layer 144 may be formed of glass, for example and may further contain a reflective material so as to allow light emitted from the light emitting element 130 to be easily reflected in an upward direction. In the exemplary embodiment, the second protective layer 144 may be disposed to cover all of upper and side surfaces of the wavelength conversion part 150a, but examples of the present disclosure are not limited thereto. For example, in a modified example, the side surface of the wavelength conversion part 150a may be enclosed by the first protective layer 142.

Figure 6:
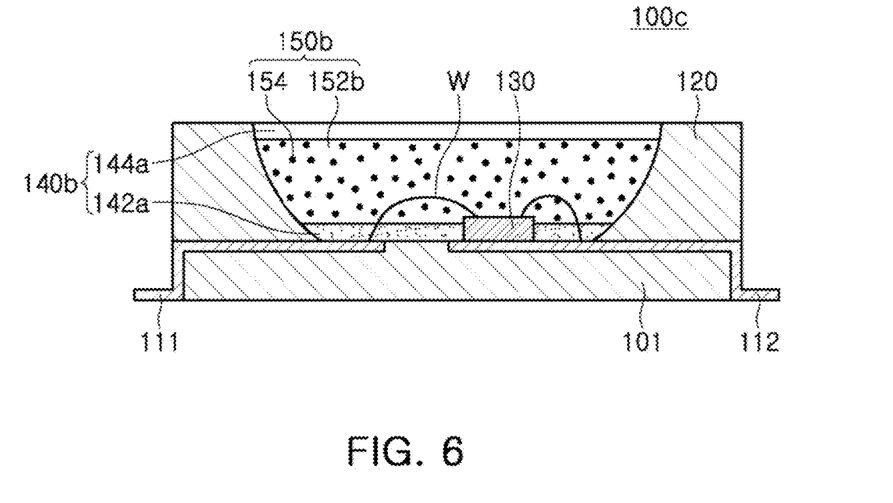
FIG. 6 is a schematic cross-sectional view of a light emitting device according to an exemplary embodiment of the present disclosure.

FIG. 6 is a schematic cross-sectional view of a light emitting device according to an exemplary embodiment of the present disclosure.

Referring to FIG. 6, a light emitting device 100c may include the substrate 101, the light emitting element 130 disposed on the substrate 101, a protective layer 140b, and a wavelength conversion part 150b. The light emitting device 100c may also include the pair of lead frames 111 and 112 electrically connected to the light emitting element 130, the body part 120 having a cup shape, and the conductive wire W connecting the light emitting element 130 and the lead frames 111 and 112 to each other.

The protective layer 140b of the light emitting device 100c according to the exemplary embodiment may include a first protective layer 142a disposed on the substrate 101 and embedding the light emitting element 130 therein and a second protective layer 144a disposed on an upper portion of the wavelength conversion part 150b, unlike in the exemplary embodiment of FIG. 1. Further, unlike in the exemplary embodiment of FIG. 5, the first protective layer 142a may be disposed so as not to cover the upper surface of the light emitting element 130 and to expose the upper surface of the light emitting element 130. The side surface of the wavelength conversion part 150b may be laterally extended to come into contact with the body part 120.

Figure 7:
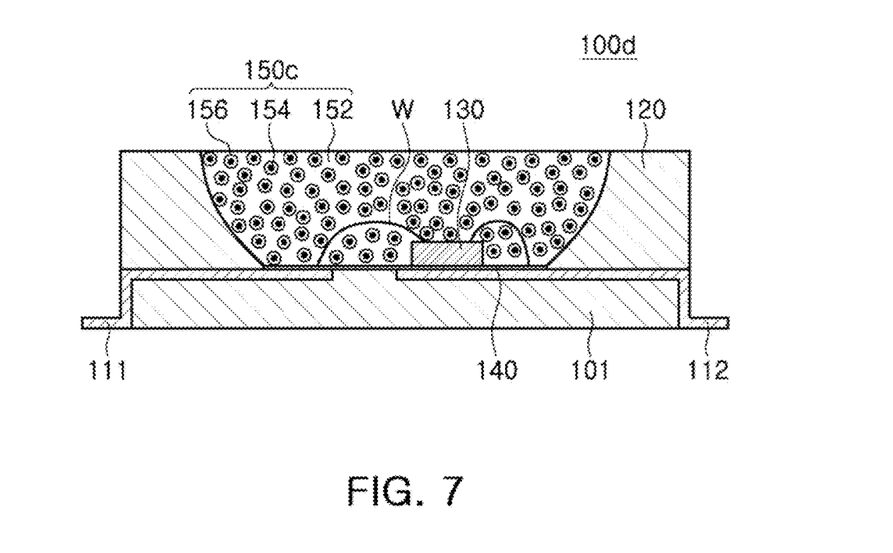
FIG. 7 is a schematic cross-sectional view of a light emitting device according to an exemplary embodiment of the present disclosure.

FIG. 7 is a schematic cross-sectional view of a light emitting device according to an exemplary embodiment of the present disclosure.

Referring to FIG. 7, a light emitting device 100d may include the substrate 101, the light emitting element 130 disposed on the substrate 101, the protective layer 140, and a wavelength conversion part 150c. Further, the light emitting device 100d may include the pair of lead frames 111 and 112 electrically connected to the light emitting element 130, the body part 120 having a cup shape, and the conductive wire W connecting the light emitting element 130 and the lead frames 111 and 112 to each other.

The wavelength conversion part 150c of the light emitting device 100d according to the exemplary embodiment may include the sealing part 152, the fluoride-based phosphors 154 dispersed within the sealing part 152, and coating layers 156 enclosing the fluoride-based phosphors 154, unlike in the exemplary embodiment of FIG. 1. The coating layers 156 may cover the entirety of particle surfaces of the fluoride-based phosphors 154.

The coating layers 156 may be formed of an organic material or an inorganic material. In a case in which the coating layers 156 are formed of an inorganic material, the coating layers 156 may be formed of silicon oxide, metal oxide or a fluoride-based material. For example, the coating layers 156 may be formed of at least one of $SiO_2$, $Al_2O_3$, ZnO, $TiO_2$, and $K_2SiF_6$. In a case in which the coating layers 156 are formed of an organic material, the coating layers 156 may be formed of, for example, an acetic acid, a stearic acid, a myristic acid, a lauric acid or the like and in particular, may be formed of a long chain n-alkyl carboxylic acid, wherein n is greater than 6.

According to the exemplary embodiment, the particle surfaces of the fluoride-based phosphors 154 may be covered by the coating layers 156, such that external moisture may be effectively blocked to thereby allow for improvements in reliability of the light emitting device 100d. In addition, the coating layers 156 according to the exemplary embodiment may also be applied to the light emitting devices 100, 100a, 100b and 100c according to other exemplary embodiments illustrated in FIGS. 1, 2, 5 and 6.

Figure 8:
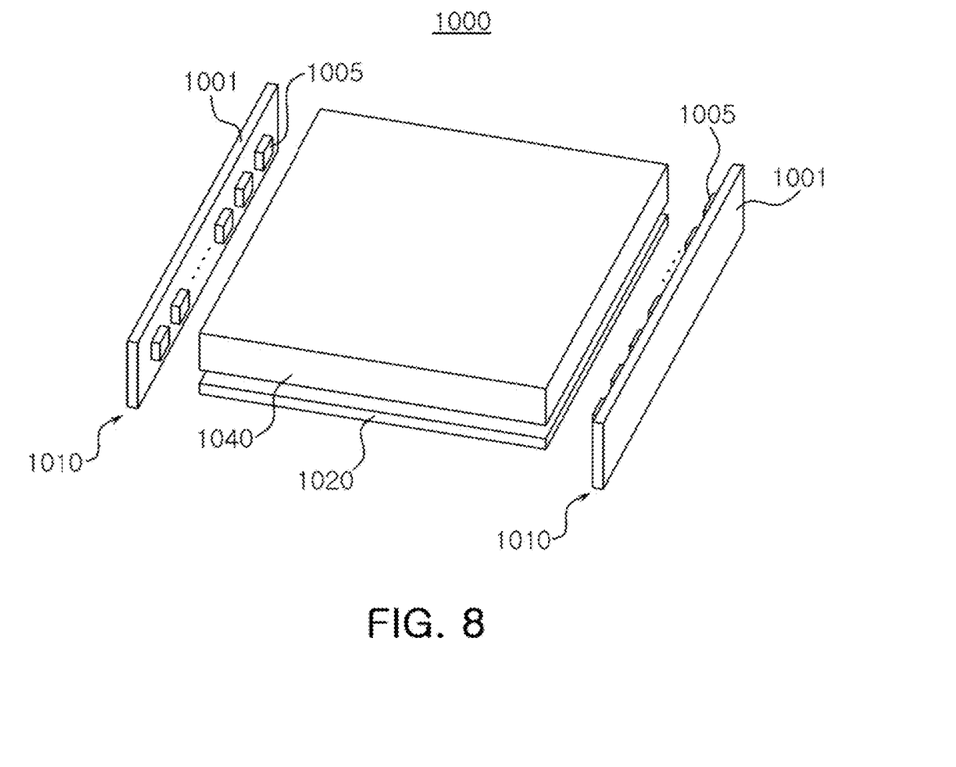
FIG. 8 is a schematic cross-sectional view of a backlight unit according to an exemplary embodiment of the present disclosure.

FIG. 8 is a schematic cross-sectional view of a backlight unit according to an exemplary embodiment of the present disclosure.

Referring to FIG. 8, a backlight unit 1000 may include a light guiding plate 1040 and light source modules 1010 provided on two opposite side surfaces of the light guiding plate 1040. Further, the backlight unit 1000 may further include a reflective plate 1020 disposed on a lower portion of the light guiding plate 1040. The backlight unit 1000 according to the exemplary embodiment may be an edge type backlight unit.

According to exemplary embodiments, the light guiding plate 1040 may be provided on one side surface of the light source module 1010 or may be additionally provided on another side surface of the light source module 1010. The light source module 1010 may include a printed circuit board 1001 and a plurality of light emitting devices 1005 mounted on an upper surface of the printed circuit board 1001. The light emitting device 1005 may include one of the light emitting devices 100, 100a, 100b, 100c and 100d illustrated in FIGS. 1 and 2 and FIGS. 5 through 7.

Figure 9:
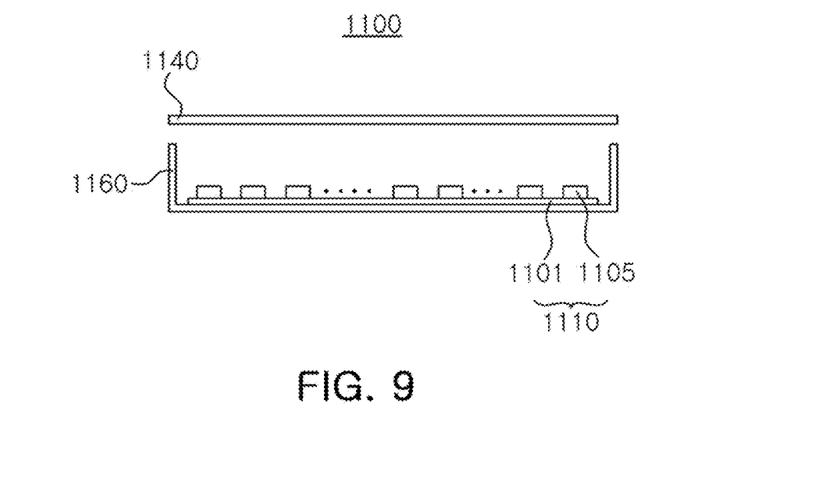
FIG. 9 is a schematic cross-sectional view of a backlight unit according to an exemplary embodiment of the present disclosure.

FIG. 9 is a schematic cross-sectional view of a backlight unit according to an exemplary embodiment of the present disclosure.

Referring to FIG. 9, a backlight unit 1100 may include a light diffusing plate 1140 and a light source module 1110 disposed below the light diffusing plate 1140. In addition, the backlight unit 1100 may further include a bottom case 1160 disposed below the light diffusing plate 1140 and accommodating the light source module 1110 therein. The backlight unit 1100 according to the exemplary embodiment may be a direct type backlight unit.

The light source module 1110 may include a printed circuit board 1101 and a plurality of light emitting devices 1105 mounted on an upper surface of the printed circuit board 1101. The light emitting device 1105 may include one of the light emitting devices 100, 100a, 100b, 100c and 100d illustrated in FIGS. 1 and 2 and FIGS. 5 through 7.

Figure 10:
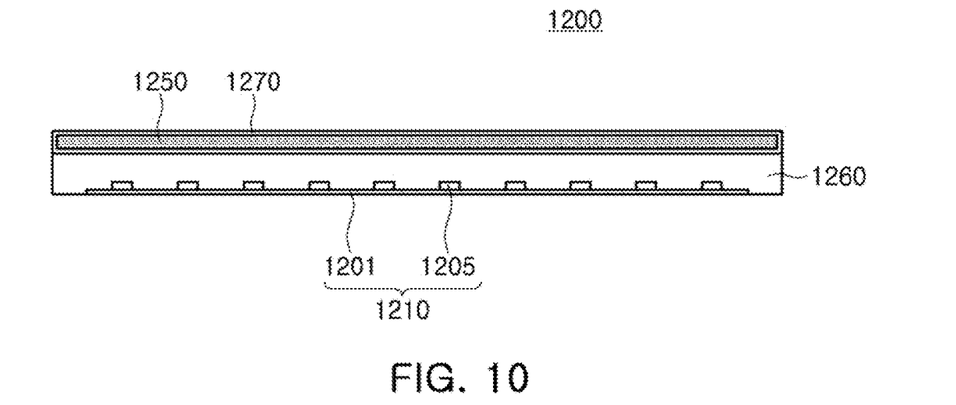
FIGS. 10 through 12 are schematic cross-sectional views of backlight units according to an exemplary embodiment of the present disclosure.
Figure 11:
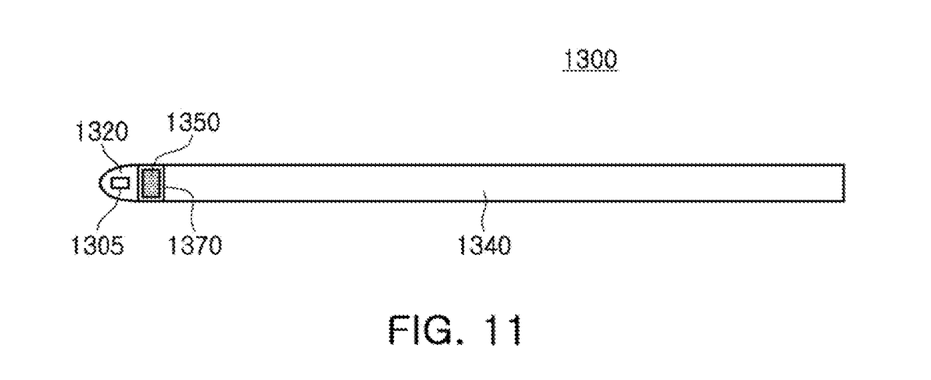
Figure 12:
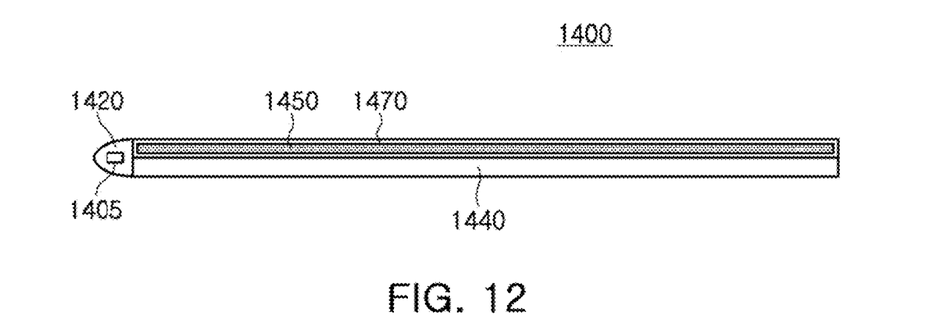

FIGS. 10 through 12 are schematic cross-sectional views of backlight units according to an exemplary embodiment of the present disclosure.

In backlight units 1200, 1300 and 1400 of FIGS. 10 to 12, the wavelength conversion part 150 (see FIG. 1) may be provided within the respective backlight units 1200, 1300 and 1400, while being disposed outwardly of the respective light emitting devices 1205, 1305 and 1405, and may convert light.

Referring to FIG. 10, the backlight unit 1200 may be a direct type backlight unit and may include a wavelength conversion part 1250, a protective layer 1270, a light source module 1210 disposed below the wavelength conversion part 1250, and a bottom case 1260 accommodating the light source module 1210 therein. In addition, the light source module 1210 may include a printed circuit board 1201 and a plurality of light emitting devices 1205 mounted on an upper surface of the printed circuit board 1201. The light emitting device 1205 may include a light emitting device in which the wavelength conversion part 150, 150a, 150b or 150c is omitted from one of the light emitting devices 100, 100a, 100b, 100c and 100d illustrated in FIGS. 1 and 2 and FIGS. 5 through 7.

In the backlight unit 1200 according to the exemplary embodiment, the wavelength conversion part 1250 enclosed by a protective layer 1270 may be disposed on the bottom case 1260. The wavelength conversion part 1250 may include fluoride-based phosphors in a similar manner to the wavelength conversion part 150 of FIG. 1. Thus, at least one portion of light emitted from the light source module 1210 may be wavelength-converted by the wavelength conversion part 1250. The wavelength conversion part 1250 may be fabricated and used as a separate film, but may be integrally combined with a light diffusing plate to be used.

The protective layer 1270 may protect the fluoride-based phosphors contained in the wavelength conversion part 1250 from external environmental factors, in particular, moisture, such that reliability of the backlight unit 1200 may be secured. Thus, the protective layer 1270 may be formed of a moisture-proofing material capable of preventing the permeation of moisture, and a thickness and a shape of the protective layer 1270 are not limited to the embodiment illustrated in FIG. 10. The protective layer 1270 may be formed of a resin such as epoxy, silicon, modified silicon, a urethane resin, an oxetane resin, acrylics, polycarbonate, polyimide or the like. Alternatively, the protective layer 1270 may be a coating layer formed of a fluoride-based coating agent or a silica-based coating agent.

Referring to FIGS. 11 and 12, the backlight units 1300 and 1400 may be edge type backlight units and include wavelength conversion parts 1350 and 1450, protective layers 1370 and 1470, light guiding plates 1340 and 1440, reflective parts 1320 and 1420 disposed at one ends of the light guiding plates 1340 and 1440, and light sources 1305 and 1405.

Light emitted from the light sources 1305 and 1405 may be guided to the interiors of the light guiding plates 1340 and 1440 by the reflective parts 1320 and 1420. In the backlight unit 1300 of FIG. 11, the wavelength conversion part 1350 may be enclosed by the protective layer 1370 and may be disposed between the light guiding plate 1340 and the light source 1305. In the backlight unit 1400 of FIG. 12, the wavelength conversion part 1450 may be enclosed by the protective layer 1470 and may be disposed on a light emitting surface of the light guiding plate 1440.

The light source 1305 or 1405 may include a light emitting device in which the wavelength conversion part 150, 150a, 150b or 150c is omitted from one of the light emitting devices 100, 100a, 100b, 100c and 100d illustrated in FIGS. 1 and 2 and FIGS. 5 through 7. With regard to the description of the protective layers 1370 and 1470, explanations regarding the protective layer 1270 of FIG. 10 will be referred.

Figure 13:
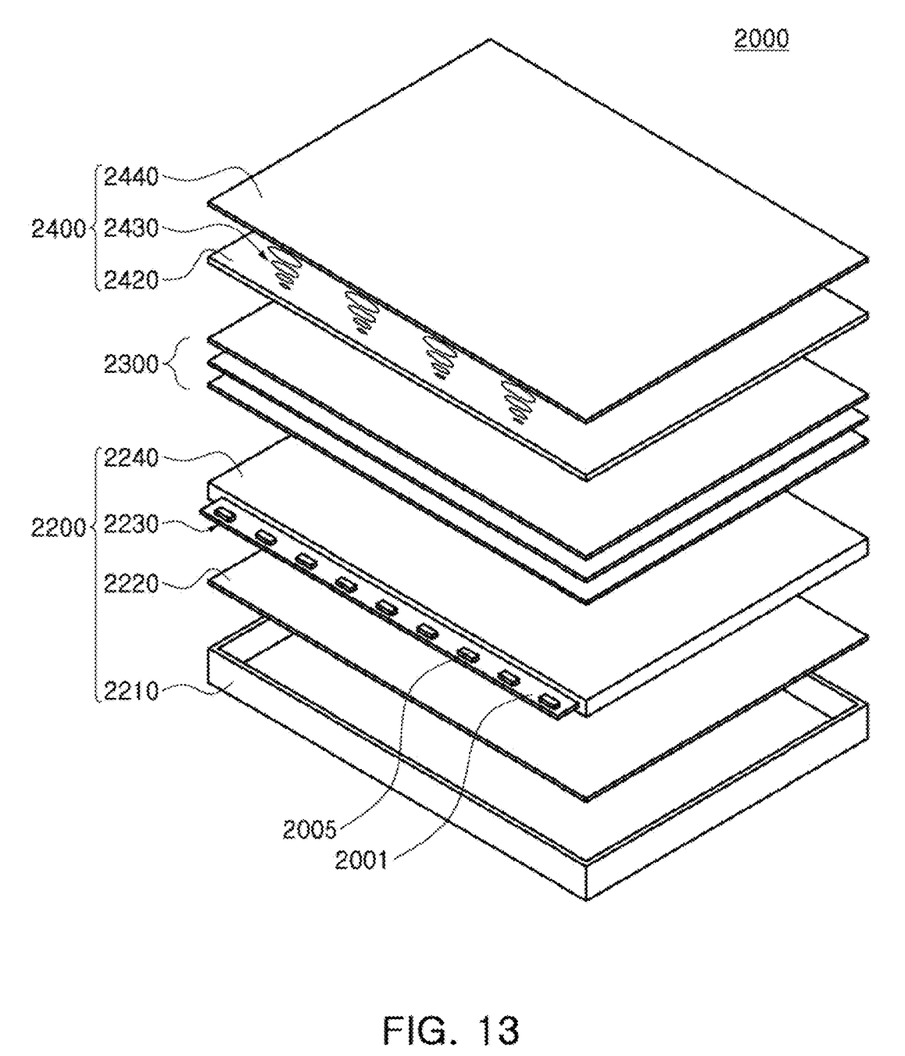
FIG. 13 is a schematic exploded perspective view of a display apparatus according to an exemplary embodiment of the present disclosure.

FIG. 13 is a schematic exploded perspective view of a display apparatus according to an exemplary embodiment of the present disclosure.

Referring to FIG. 13, a display apparatus 2000 may include a backlight unit 2200, optical sheets 2300, and an image display panel 2400 such as a liquid crystal panel.

The backlight unit 2200 may include a bottom case 2210, a reflective plate 2220, a light guiding plate 2240, and a light source module 2230 provided on at least one side surface of the light guiding plate 2240. The light source module 2230 may include a printed circuit board 2001 and light emitting devices 2005. The light emitting device 2005 may include one of the light emitting devices 100, 100a, 100b, 100c and 100d illustrated in FIGS. 1 and 2 and FIGS. 5 through 7. In particular, the light emitting device 2005 may be a side-view type light emitting device in which a mounting surface thereof is a side surface adjacent to a light emitting surface thereof. In addition, according to exemplary embodiments, the backlight unit 2200 may be substituted with one of the backlight units 1000, 1100, 1200, 1300 and 1400 of FIGS. 8 through 12.

The optical sheets 2300 may be disposed between the light guiding plate 2240 and the image display panel 2400, and may include various types of sheets such as a diffusion sheet, a prism sheet, or a protective sheet.

The image display panel 2400 may display an image using light emitted through the optical sheets 2300. The image display panel 2400 may include an array substrate 2420, a liquid crystal layer 2430, and a color filter substrate 2440. The array substrate 2420 may include pixel electrodes arranged in a matrix form, thin film transistors applying a driving voltage to the pixel electrodes, and signal lines for operating the thin film transistors. The color filter substrate 2440 may include a transparent substrate, a color filer, and a common electrode. The color filter may include filter elements allowing light having a certain wavelength from among white light emitted from the backlight unit 2200 to selectively pass therethrough. The liquid crystal layer 2430 may be rearranged due to an electrical field formed between the pixel electrode and the common electrode, thereby controlling light transmissivity. Light having controlled light transmissivity may pass through the color filter of the color filter substrate 2440 to display an image. The image display panel 2400 may further include a driving circuit unit processing an image signal and the like.

According to the display apparatus 2000 according to the exemplary embodiment, the light emitting device 2005 emitting blue light, green light and red light each having a full width at half maximum (FWHM) of 35 nm or less may be used. Thus, after the emitted light passes through the color filter substrate 2440, blue light, green light and red light having high color purity may be realized.

Figure 14:
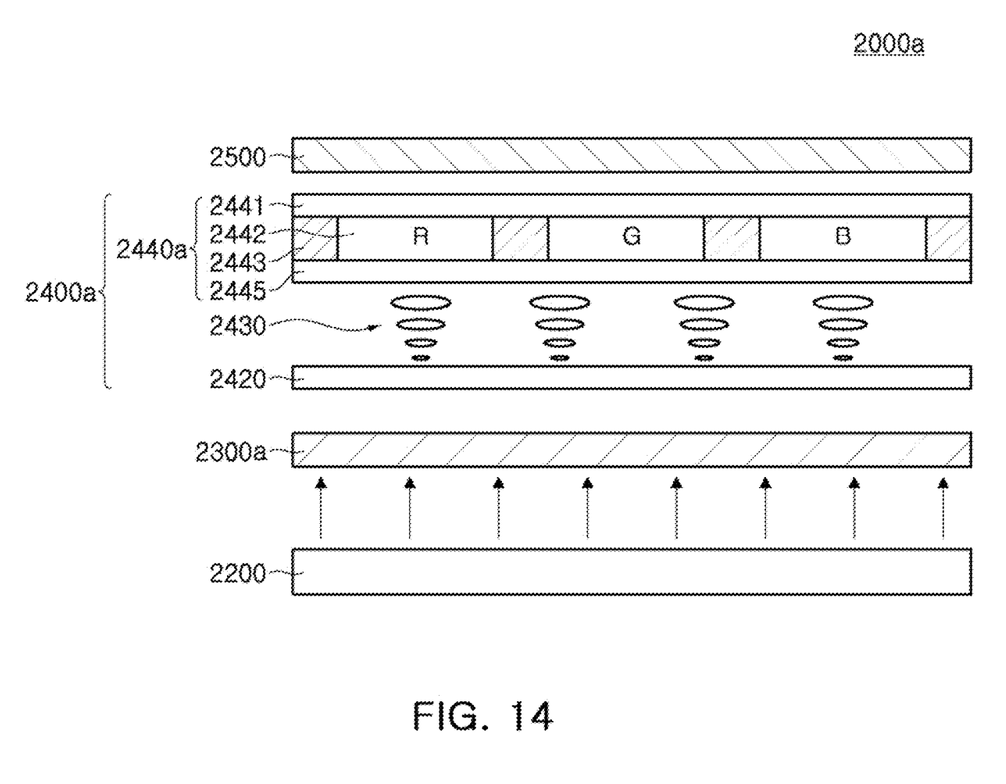
FIG. 14 is a schematic cross-sectional view of a display apparatus according to an exemplary embodiment of the present disclosure.

FIG. 14 is a schematic cross-sectional view of a display apparatus according to an exemplary embodiment of the present disclosure.

Referring to FIG. 14, a display apparatus 2000a may include the backlight unit 2200, a first optical sheet 2300a, and an image display panel 2400a. The display apparatus 2000a according to the exemplary embodiment may further include a second optical sheet 2500 disposed above the image display panel 2400a.

The first and second optical sheets 2300a and 2500 may divide incident light into two polarizing components orthogonal with respect to each other so that only one component is allowed to pass therethrough. The image display panel 2400a may include an array substrate 2420, a liquid crystal layer 2430, and a color filter substrate 2440a. The color filter substrate 2440a may include a color filter substrate 2441, a color filter 2442, and light shielding patterns 2443 and a common electrode 2445.

The color filter 2442 may include three regions R, G, and B such that light beams passing therethrough are emitted as red light, green light, and blue light, respectively. The light shielding patterns 2443 may be disposed between the regions R, G, and B so that the penetration of light into pixel boundaries may be blocked.

In certain embodiments, the backlight unit 2200 may include a light emitting device in which the wavelength conversion part 150, 150a, 150b or 150c is omitted from one of the light emitting devices 100, 100a, 100b, 100c and 100d illustrated in FIGS. 1 and 2 and FIGS. 5 through 7. Thus, the backlight unit 2200 may only emit light having a single wavelength, for example, blue light. In this case, wavelength conversion materials may be present within two regions R and G among the three regions R, G, and B. For example, the above described fluoride-based phosphors may be disposed in the red region R, green phosphors may be disposed in the green region G, and any phosphors may not be disposed in the blue region B so that incident light passes therethrough as it is. In particular, in the red region G as in the exemplary embodiment in connection with FIG. 1, the sealing part in which fluoride-based phosphors are dispersed may be covered by a separate protective layer.

As set forth above, according to exemplary embodiments of the present disclosure, a light emitting device, a backlight unit, and a display apparatus having high color purity and improved reliability may be provided by using a light emitting element emitting green light and blue light and a fluoride-based phosphor emitting red light.

Various advantages and effects in exemplary embodiments of the present disclosure are not limited to the above-described descriptions and may be easily understood through explanations of concrete embodiments of the present disclosure.

While exemplary embodiments have been shown and described above, it will be apparent to those skilled in the art that modifications and variations could be made without departing from the spirit and scope of the present disclosure as defined by the appended claims.

What is claimed is:

1. A light emitting device, comprising:
a substrate;
a single light emitting element mounted on the substrate, the single light emitting element emitting both blue light and green light, the blue light having a peak in a wavelength range of about 370 nm to 500 nm, and the green light having a peak in a wavelength range of about 500 nm to 600 nm; and
a wavelength conversion part that wavelength-converts a portion of light emitted from the single light emitting element into red light, the wavelength conversion part including fluoride-based phosphors represented by Chemical Formula: $A_xMF_y$:$Mn^{4+}$ ($2 \le x \le 3$ and $4 \le y \le 7$, where element A is at least one selected from a group consisting of Li, Na, K, Rb, and Cs and element M is at least one selected from a group consisting of Si, Ti, Zr, Hf, Ge and Sn) and organic or inorganic coating layers enclosing the fluoride-based phosphors, wherein:
emission of the blue light is driven by a first electrode and a second electrode, and emission of the green light is simultaneously driven by the same first and second electrodes that drive emission of the blue light, and
the blue light peak, the green light peak, and a peak of the red light have a full width at half maximum (FWHM) of less than 35 nm.

2. The light emitting device of claim 1, wherein the red light has a full width at half maximum (FWHM) of less than 10 nm.

3. The light emitting device of claim 1, wherein the single light emitting element includes an active layer including first and second quantum well layers serially connected and having different band gap energies, the first quantum well layer corresponding to a region emitting the green light and the second quantum well layer corresponding to a region emitting the blue light.

4. The light emitting device of claim 1, wherein the single light emitting element has a first region in which light emitting nanostructures are spaced apart from each other by a first distance and a second region in which light emitting nanostructures are spaced apart from each other by a second distance greater than the first distance.

5. The light emitting device of claim 4, wherein in the first and second regions, the light emitting nanostructures contain different contents of indium (In).

6. The light emitting device of claim 1, further comprising: a protective layer disposed on at least one surface of the wavelength conversion part and performing moisture-proofing functions.

7. The light emitting device of claim 6, wherein the protective layer includes a first protective layer disposed between the substrate and the wavelength conversion part and a second protective layer disposed on an upper surface of the wavelength conversion part.

8. The light emitting device of claim 6, wherein the wavelength conversion part is enclosed by the protective layer.

9. The light emitting device of claim 6, wherein the protective layer is a moisture-proofing coating layer or a resin layer.

10. A backlight unit, comprising:
a light guiding plate;
a light source module disposed on at least one side surface of the light guiding plate, providing light to an interior of the light guiding plate, and including a circuit board and a plurality of light emitting elements, each of the light emitting elements emitting both blue light and green light, the blue light having a peak in a wavelength range of about 370 nm to 500 nm, and the green light having a peak in a wavelength range of about 500 nm to 600 nm; and
a wavelength conversion part that wavelength-converts a portion of light emitted from the plurality of light emitting elements into red light, the wavelength conversion part including fluoride-based phosphors represented by Chemical Formula: $A_xMF_y$:$Mn^{4+}$ ($2 \le x \le 3$ and $4 \le y \le 7$, where element A is at least one selected from a group consisting of Li, Na, K, Rb, and Cs and element M is at least one selected from a group consisting of Si, Ti, Zr, Hf, Ge and Sn) and organic or inorganic coating layers enclosing the fluoride-based phosphors, wherein:
in each light emitting element of the plurality of light emitting elements, emission of the blue light is driven by a first electrode and a second electrode, and emission of the green light is simultaneously driven by the same first and second electrodes that drive emission of the blue light.

11. The backlight unit of claim 10, wherein the wavelength conversion part includes a plurality of wavelength conversion parts respectively disposed above the plurality of light emitting elements.

12. The backlight unit of claim 10, wherein the wavelength conversion part is disposed on one surface of the light guiding plate.

13. The backlight unit of claim 10, wherein each of the light emitting elements emits blue light and green light simultaneously.

14. A display apparatus, comprising:
a backlight unit including a light guiding plate and a plurality of light emitting elements, each of the light emitting elements emitting both blue light and green light, the blue light having a peak in a wavelength range of about 370 nm to 500 nm, and the green light having a peak in a wavelength range of about 500 nm to 600 nm;
at least one optical sheet disposed on the backlight unit; and
a liquid crystal panel disposed on the optical sheet and including a liquid crystal layer and a color filter, wherein:
the backlight unit or the liquid crystal panel includes a wavelength conversion part disposed therein, the wavelength conversion part wavelength-converting a portion of light emitted from the light emitting element into red light, the wavelength conversion part including fluoride-based phosphors represented by Chemical Formula: $A_xMF_y$:$Mn^{4+}$ ($2 \le x \le 3$ and $4 \le y \le 7$, where element A is at least one selected from a group consisting of Li, Na, K, Rb, and Cs and element M is at least one selected from a group consisting of Si, Ti, Zr, Hf, Ge and Sn), and
in each light emitting element of the plurality of light emitting elements, emission of the blue light is driven by a first electrode and a second electrode, and emission of the green light is simultaneously driven by the same first and second electrodes that drive emission of the blue light.

15. A light emitting device, comprising:
a substrate;
a single light emitting element mounted on the substrate, the single light emitting element emitting both blue light and green light, the blue light having a peak in a wavelength range of about 370 nm to 500 nm, and the green light having a peak in a wavelength range of about 500 nm to 600 nm;
a wavelength conversion part that wavelength-converts a portion of light emitted from the single light emitting element into red light, the wavelength conversion part including fluoride-based phosphors represented by Chemical Formula: $A_xMF_y:Mn^{4+}$ ($2 \leq x \leq 3$ and $4 \leq y \leq 7$, where element A is at least one selected from a group consisting of Li, Na, K, Rb, and Cs and element M is at least one selected from a group consisting of Si, Ti, Zr, Hf, Ge and Sn); and
a coating layer protecting the fluoride-based phosphors, wherein:
emission of the blue light is driven by a first electrode and a second electrode, and emission of the green light is simultaneously driven by the same first and second electrodes that drive emission of the blue light.

16. The light emitting device of claim 15, wherein the coating layer is a moisture-proofing layer.

17. The light emitting device of claim 15, wherein the coating layer includes organic or inorganic coating layers enclosing each of the fluoride-based phosphors.

18. The light emitting device of claim 15, wherein the coating layer includes a protective layer disposed on at least one surface of the wavelength conversion part.

19. The light emitting device of claim 15, wherein the red light has a full width at half maximum (FWHM) of less than 10 nm.

* * * * *